(12) United States Patent
Ogura

(10) Patent No.: US 11,784,630 B2
(45) Date of Patent: Oct. 10, 2023

(54) VIBRATOR DEVICE

(71) Applicant: SEIKO EPSON CORPORATION, Tokyo (JP)

(72) Inventor: Seiichiro Ogura, Minowa-machi (JP)

(73) Assignee: SEIKO EPSON CORPORATION, Tokyo (JP)

( * ) Notice: Subject to any disclaimer, the term of this patent is extended or adjusted under 35 U.S.C. 154(b) by 290 days.

(21) Appl. No.: 17/081,315

(22) Filed: Oct. 27, 2020

(65) Prior Publication Data

US 2021/0135652 A1   May 6, 2021

(30) Foreign Application Priority Data

Oct. 30, 2019   (JP) .................................. 2019-197844

(51) Int. Cl.
| | |
|---|---|
| *H03H 9/19* | (2006.01) |
| *H03H 9/13* | (2006.01) |
| *H03H 9/05* | (2006.01) |
| *G01P 3/44* | (2006.01) |
| *H03H 9/10* | (2006.01) |

(52) U.S. Cl.
CPC .................. *H03H 9/19* (2013.01); *G01P 3/44* (2013.01); *H03H 9/0557* (2013.01); *H03H 9/0595* (2013.01); *H03H 9/105* (2013.01); *H03H 9/132* (2013.01)

(58) Field of Classification Search
CPC ........ H03H 9/19; H03H 9/0595; H03H 9/105; H03H 9/13; H03H 9/0557
See application file for complete search history.

(56) References Cited

U.S. PATENT DOCUMENTS

| | | | |
|---|---|---|---|
| 2018/0274922 A1 | 9/2018 | Nishizawa et al. | |
| 2019/0165759 A1 | 5/2019 | Nishizawa et al. | |
| 2019/0301865 A1 | 10/2019 | Yamaguchi et al. | |
| 2020/0309526 A1* | 10/2020 | Nishizawa | G01C 19/574 |

FOREIGN PATENT DOCUMENTS

| | | |
|---|---|---|
| JP | 2018-159674 | 10/2018 |
| JP | 2019-102858 | 6/2019 |
| JP | 2019-178905 A | 10/2019 |

* cited by examiner

*Primary Examiner* — Jaydi San Martin
(74) *Attorney, Agent, or Firm* — Rankin, Hill & Clark LLP

(57) ABSTRACT

A vibrator device has the vibrator element, a support substrate supporting the vibrator element, and a plurality of interconnections disposed on the support substrate. The support substrate includes an element mounting base, a supporting base, a frame located between the element mounting base and the supporting base, inner beams for coupling the element mounting base and the frame to each other, and outer beams for coupling the frame and the supporting base to each other. The plurality of interconnections include a drive signal interconnection and a detection signal interconnection laid around to the element mounting base and the supporting base, and the drive signal interconnection and the detection signal interconnection are laid around to the element mounting base and the frame through the respective inner beams different from each other, and are laid around to the frame and the supporting base through the respective outer beams different from each other.

7 Claims, 12 Drawing Sheets

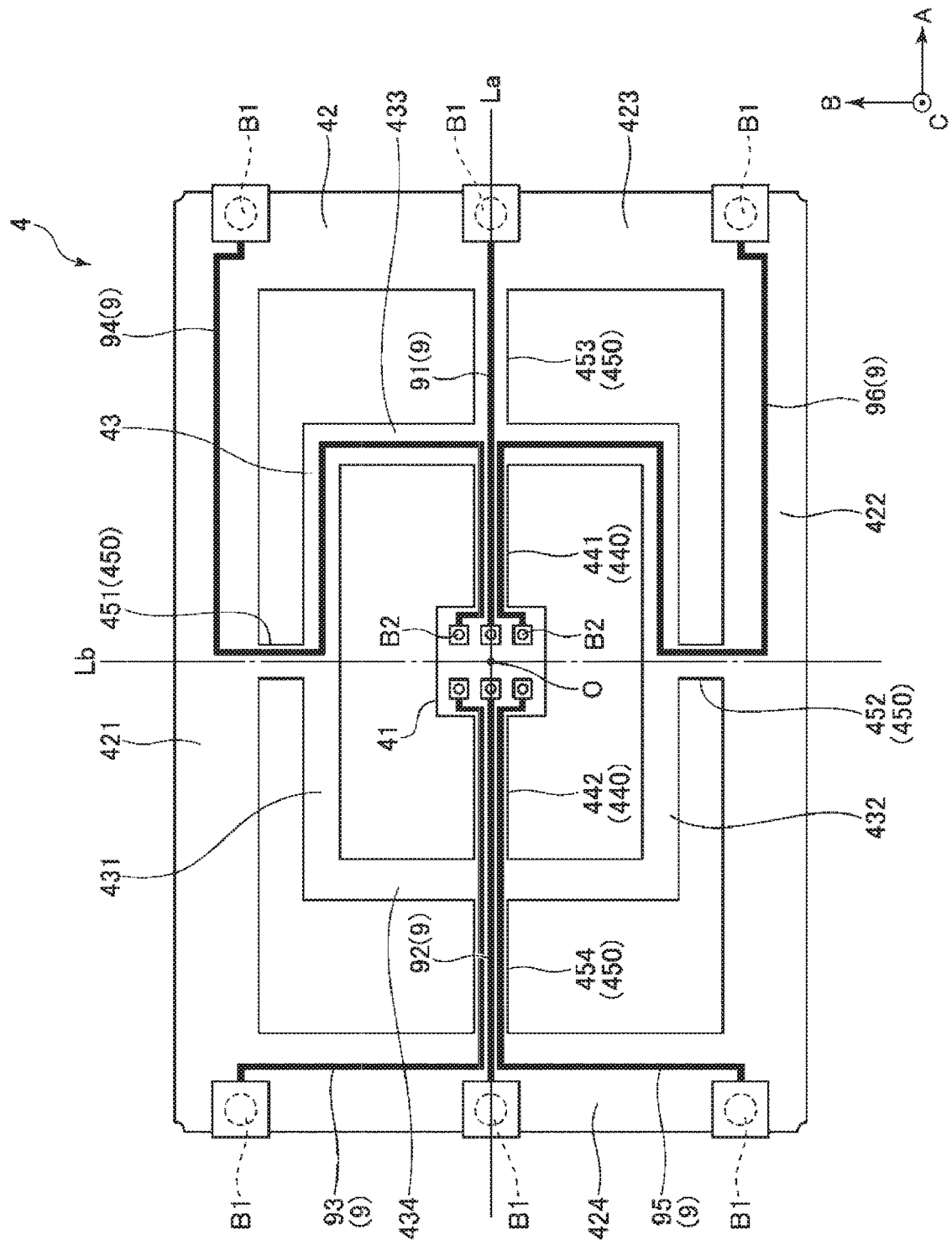

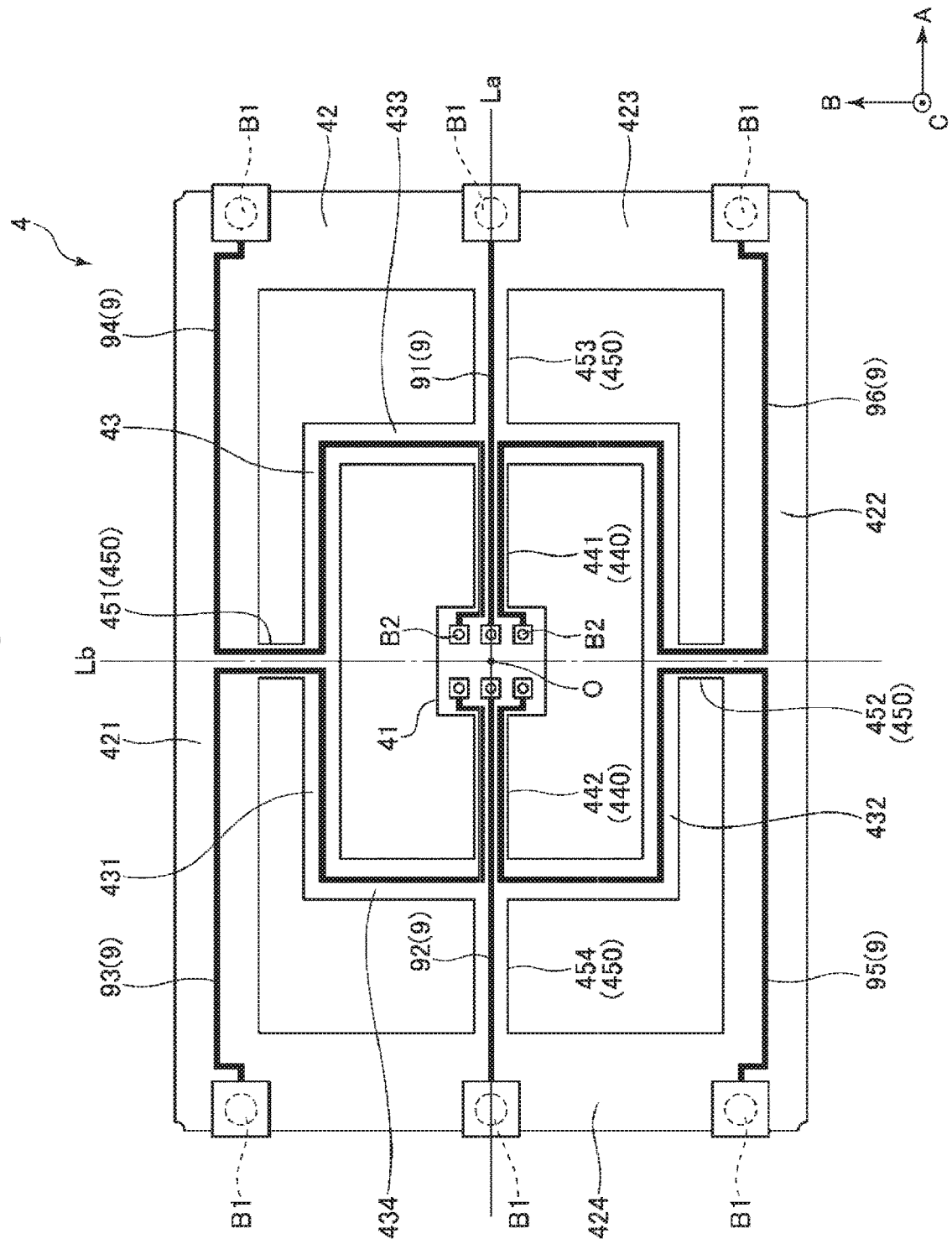

VIBRATOR DEVICE

The present application is based on, and claims priority from JP Application Serial Number 2019-197844, filed Oct. 30, 2019, the disclosure of which is hereby incorporated by reference herein in its entirety.

BACKGROUND

1. Technical Field

The present disclosure relates to a vibrator device.

2. Related Art

A vibrator device described in JP-A-2018-159674 (Document 1) includes a circuit element, a vibrator element, and a relay substrate which intervenes between the circuit element and the vibrator element to fix the vibrator element to the circuit element. Further, the relay substrate forms a gimbal structure, and has a fixed part shaped like a frame and fixed to the circuit element, a frame body part shaped like a frame and disposed inside the fixed part, a mounting part which is disposed inside the frame body part and to which the vibrator element is fixed, a first beam part for coupling the fixed part and the frame body part to each other, and a second beam part for coupling the frame body part and the mounting part to each other. Due to such a relay substrate, transmission of a stress from the circuit element to the vibrator element is suppressed.

Further, in the vibrator device described in Document 1, the mounting part is provided with six vibrator element-side terminals electrically coupled to the vibrator element, the fixed part is provided with six circuit element-side terminals electrically coupled to the circuit element, and the vibrator element-side terminals and the circuit element-side terminals corresponding to each other are electrically coupled to each other with interconnections laid on the first beam part, the frame body part, and the second beam part.

However, in the vibrator device described in Document 1, a drive signal-interconnection and a detection signal-interconnection included in the plurality of interconnections are disposed close to each other on one beam part. Therefore, there is a possibility that a noise caused by an influence of the drive signal applied to the drive signal-interconnection mixes in the detection signal-interconnection in that part to deteriorate the detection accuracy.

SUMMARY

A vibrator device according to an aspect of the present disclosure includes a vibrator element, a support substrate configured to support the vibrator element, and a plurality of interconnections provided to the support substrate, wherein the vibrator element includes a drive arm which is provided with a drive signal electrode, and performs a drive vibration in response to application of a drive signal to the drive signal electrode, and a detection arm which is provided with a detection signal electrode, and performs a detection vibration in accordance with a physical quantity of a detection target to thereby output a detection signal from the detection signal electrode, the support substrate includes, in a plan view from a thickness direction of the support substrate, an element mounting base on which the vibrator element is mounted, a supporting base located outside the element mounting base, a frame located between the element mounting base and the supporting base, and shaped like a frame surrounding the element mounting base, inner beams provided with a pair of first beams which extend toward both sides along a first direction from the element mounting base to couple the element mounting base and the frame to each other, and outer beams provided with a pair of second beams which extend toward both sides along a second direction different from the first direction from the frame to couple the frame and the supporting base to each other, the plurality of interconnections includes a drive signal interconnection which is electrically coupled to the drive signal electrode, and is laid around to the element mounting base and the supporting base, and a detection signal interconnection which is electrically coupled to the detection signal electrode, and is laid around to the element mounting base and the supporting base, and the drive signal interconnection and the detection signal interconnection are laid around to the element mounting base and the frame through the respective inner beams different from each other, and are laid around to the frame and the supporting base through the respective outer beams different from each other.

In the aspect of the present disclosure, the outer beams may include a third beam which extends from the frame to couple the frame and the supporting base to each other, and one of the drive signal interconnection and the detection signal interconnection may be laid around to the frame and the supporting base through the third beam.

In the aspect of the present disclosure, the outer beams may include a pair of the third beams extending from the frame toward both sides of the frame, and the drive signal interconnection and the detection signal interconnection may be laid around to the frame and the supporting base through the respective third beams different from each other.

In the aspect of the present disclosure, in the plan view, the third beam may extend in the first direction, and may be located in alignment with the first beams.

In the aspect of the present disclosure, a number of the interconnections passing through the third beam may be no larger than two.

In the aspect of the present disclosure, defining three axes perpendicular to each other as an A axis, a B axis, and a C axis, a thickness direction of the support substrate may be parallel to the C axis, and the vibrator element may include a base member fixed to the element mounting base, a pair of the detection arms extending toward both sides along the B axis from the base member, a pair of coupling arms extending toward both sides along the A axis from the base member, a pair of the drive arms extending toward both sides along the B axis from a tip part of one of the coupling arms, and a pair of the drive arms extending toward both sides along the B axis from a tip part of the other of the coupling arms.

In the aspect of the present disclosure, the first direction may be a direction along the A axis, and the second direction may be a direction along the B axis.

BRIEF DESCRIPTION OF THE DRAWINGS

FIG. 13 is a plan view showing a support substrate provided to a vibrator device according to a fourth embodiment.

FIG. 14 is a plan view showing a modified example of the support substrate shown in FIG. 13.

DESCRIPTION OF EXEMPLARY EMBODIMENTS

First Embodiment

Figure 1:
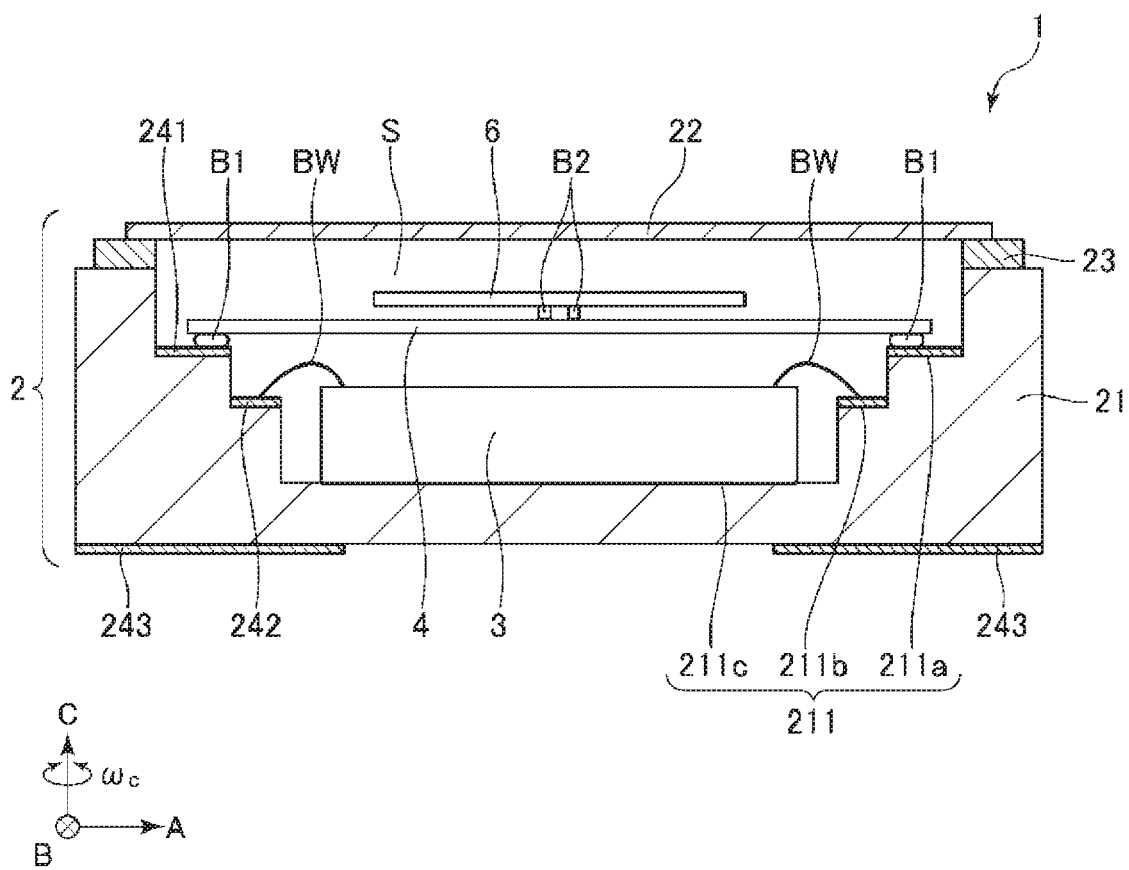
FIG. 1 is a cross-sectional view showing a vibrator device according to a first embodiment.
Figure 2:
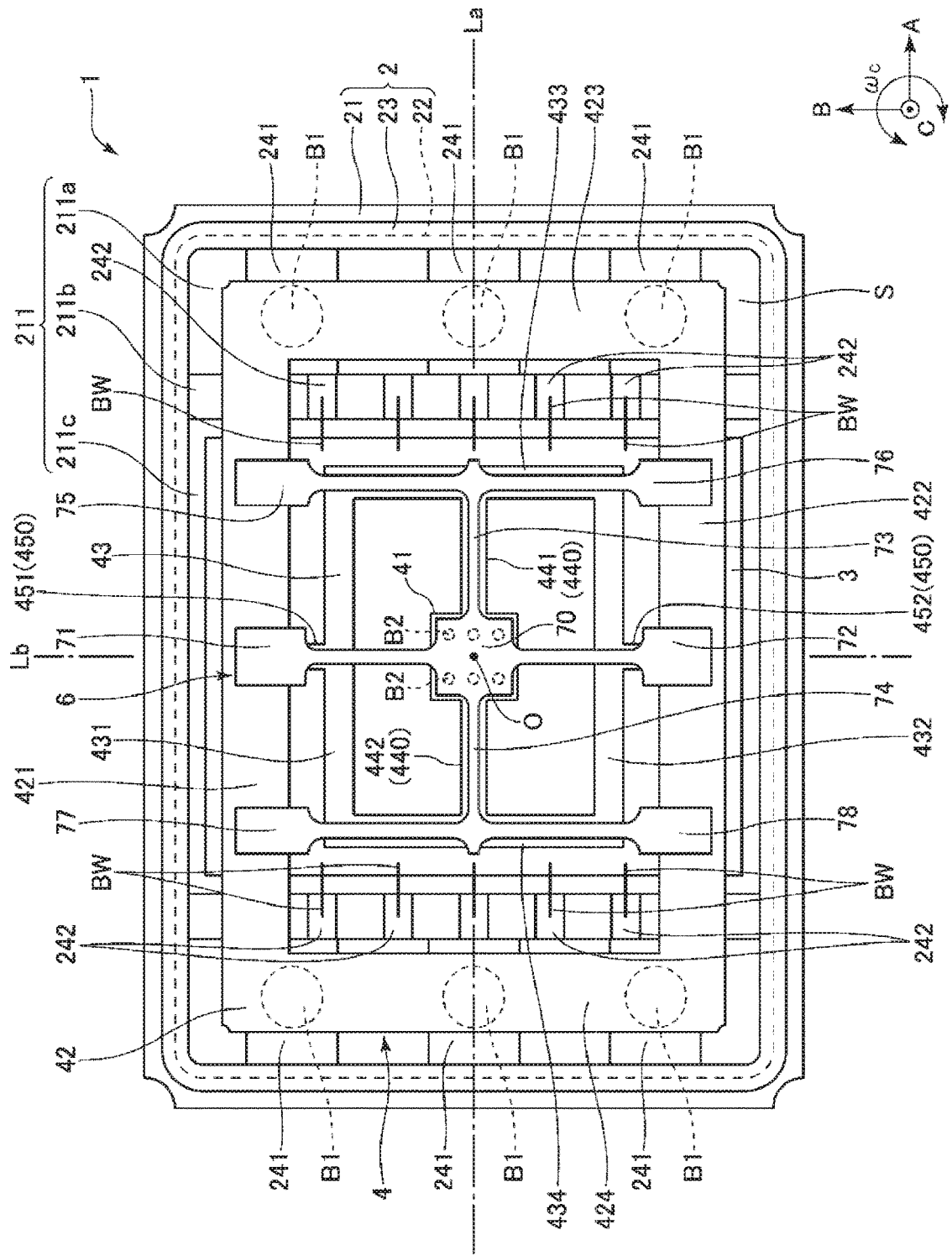
FIG. 2 is a plan view showing the vibrator device shown in FIG. 1.
Figure 3:
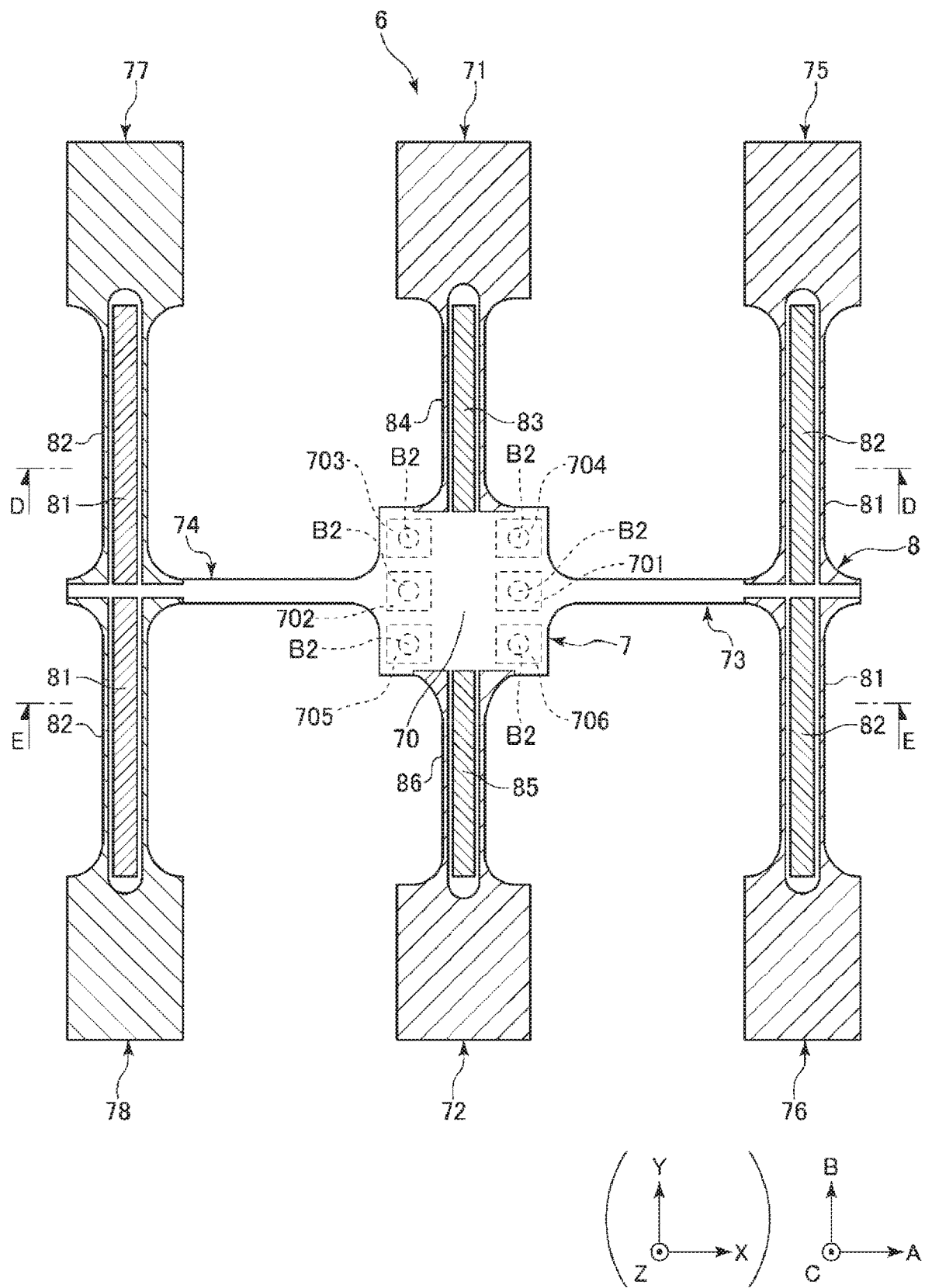
FIG. 3 is a plan view showing a vibrator element provided to the vibrator device shown in FIG. 1.
Figure 4:
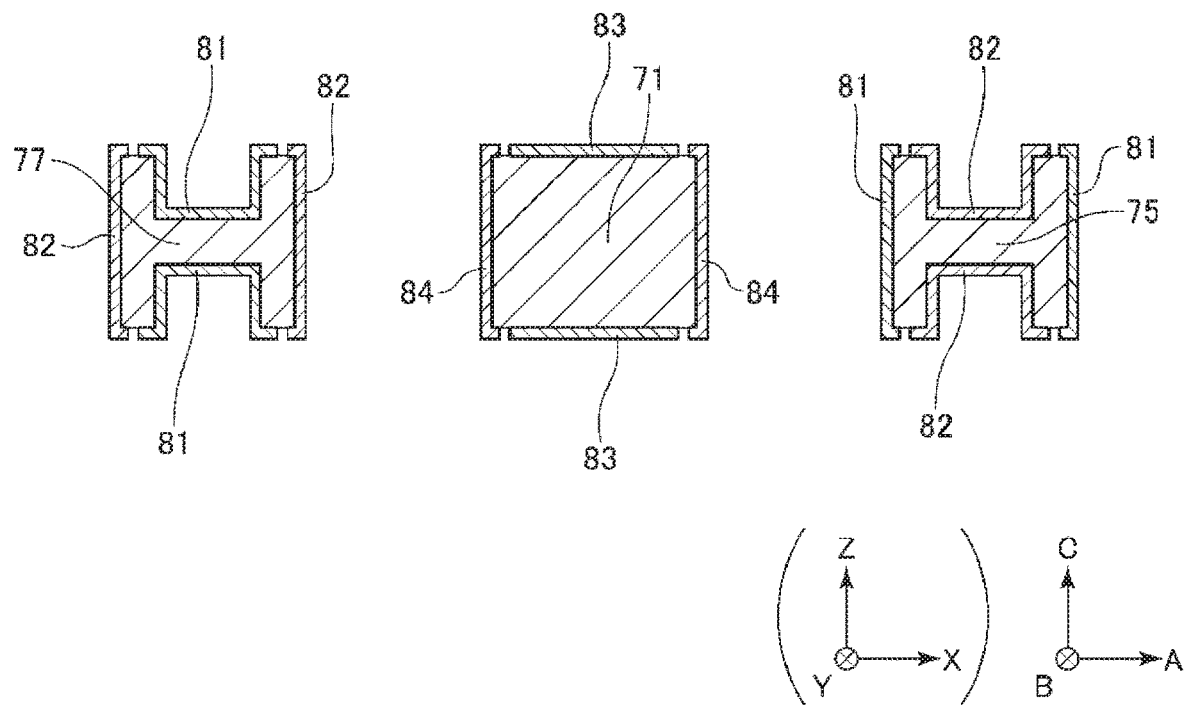
FIG. 4 is a cross-sectional view along the line D-D in FIG. 3.
Figure 5:
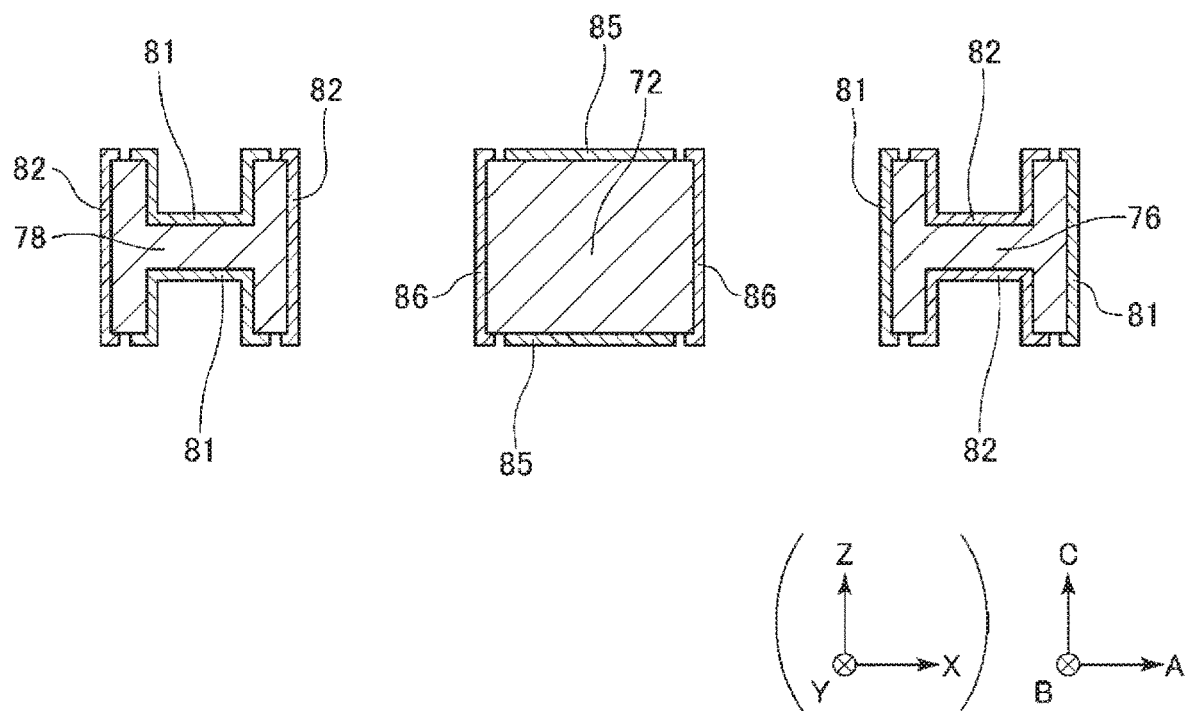
FIG. 5 is a cross-sectional view along the line E-E in FIG. 3.
Figure 6:
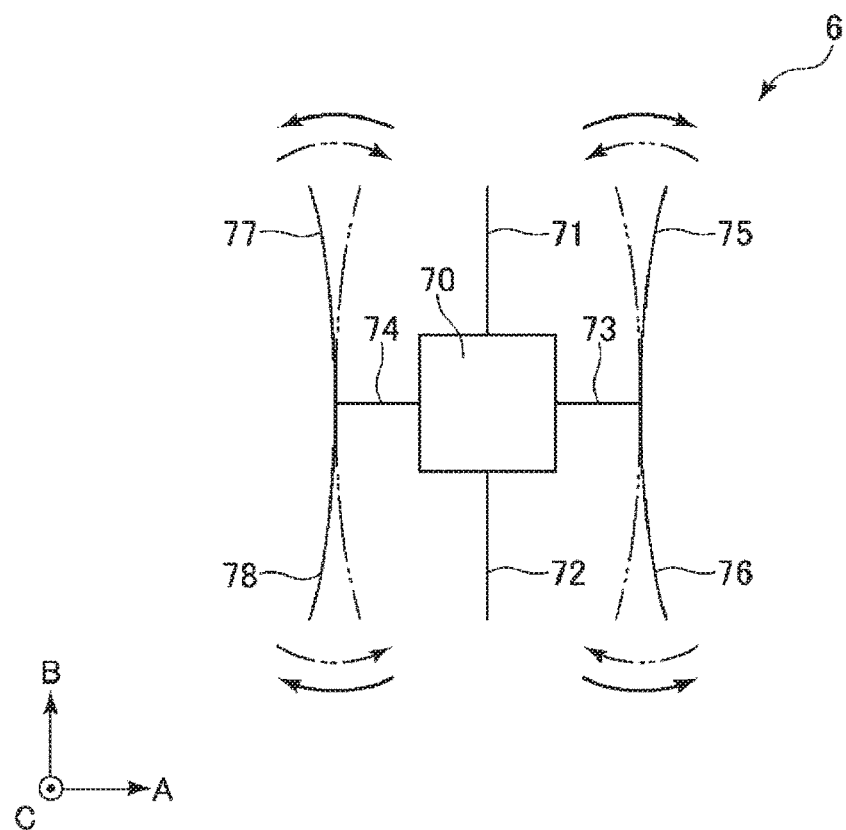
FIG. 6 is a schematic diagram for explaining drive of the vibrator element shown in FIG. 3.
Figure 7:
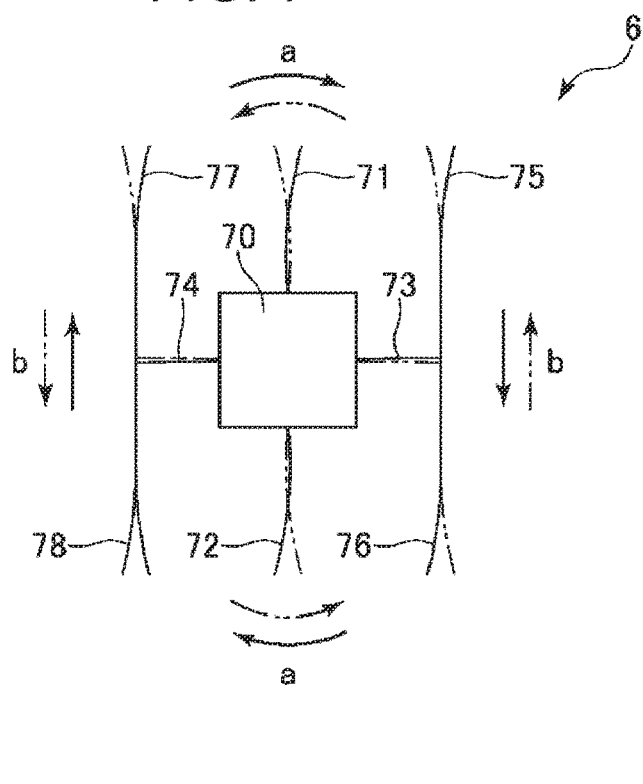
FIG. 7 is a schematic diagram for explaining the drive of the vibrator element shown in FIG. 3.
Figure 8:
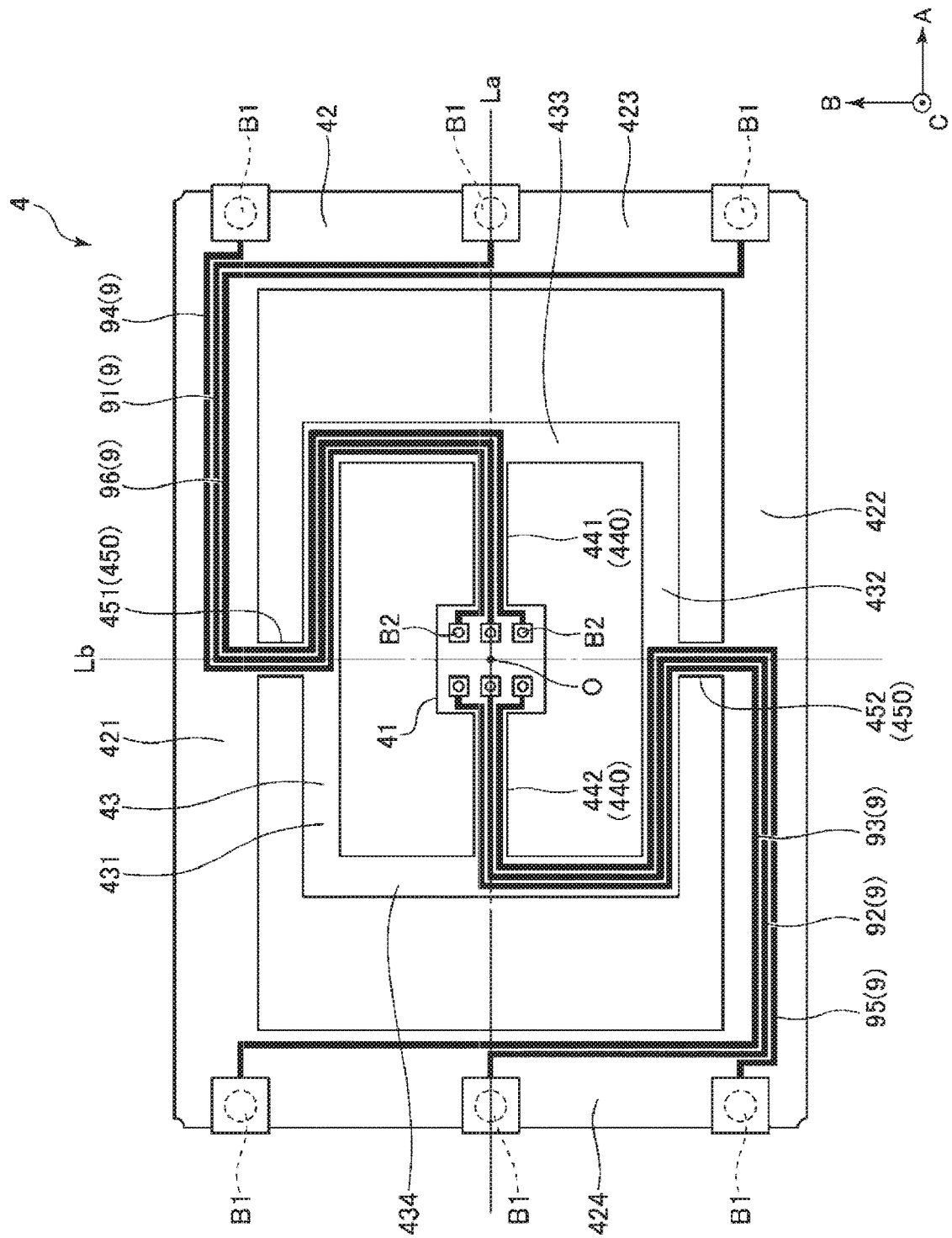
FIG. 8 is a plan view showing a support substrate.

FIG. 1 is a cross-sectional view showing the vibrator device according to a first embodiment. FIG. 2 is a plan view showing the vibrator device shown in FIG. 1. FIG. 3 is a plan view showing a vibrator element provided to the vibrator device shown in FIG. 1. FIG. 4 is a cross-sectional view along the line D-D in FIG. 3. FIG. 5 is a cross-sectional view along the line E-E in FIG. 3. FIG. 6 and FIG. 7 are each a schematic diagram for explaining drive of the vibrator element shown in FIG. 3. FIG. 8 is a plan view showing a support substrate.

It should be noted that in FIG. 1 through FIG. 8, there are shown an A axis, a B axis, and a C axis as three axes perpendicular to each other for the sake of convenience of explanation. Further, hereinafter, the tip side of the arrow of each of the axes is also referred to as a "positive side," and the opposite side is also referred to as a "negative side." Further, the positive side and the negative side are also referred to as "both sides." Further, the positive side of the C axis is also referred to as an "upper side," and the negative side thereof is also referred to as a "lower side." Further, the plan view from a thickness direction of the support substrate 4, namely a direction along the C axis, is also referred to simply as a "plan view."

The vibrator device 1 shown in FIG. 1 is a physical quantity sensor for detecting angular velocity ωc defining the C axis as the detection axis. By applying the vibrator device 1 to a physical quantity sensor, it is possible to install the vibrator device 1 in a wide variety of electronic apparatuses, and thus, the vibrator device 1 which has a high demand, and is high in convenience is achieved. Such a vibrator device 1 has a package 2, a circuit element 3 housed in the package 2, the support substrate 4, and a vibrator element 6.

The package 2 has a base 21 provided with a recessed part 211 opening in an upper surface, and a lid 22 which is bonded to the upper surface of the base 21 via a bonding member 23 so as to close the opening of the recessed part 211. The recessed part 211 forms an internal space S inside the package 2, and the circuit element 3, the support substrate 4, and the vibrator element 6 are housed in the internal space S. For example, the base 21 can be formed of ceramics such as alumina, and the lid 22 can be formed of a metal material such as kovar. It should be noted that the constituent material of each of the base 21 and the lid 22 is not particularly limited.

The internal space S is airtightly sealed, and is set in a reduced-pressure state, and more preferably a state approximate to a vacuum state. Thus, the viscosity resistance reduces and the vibration characteristics of the vibrator element 6 are improved. It should be noted that the atmosphere in the internal space S is not particularly limited, but can also be, for example, in the atmospheric pressure state or a pressurized state.

Further, the recessed part 211 is constituted by a plurality of recessed parts arranged side by side in a direction along the C axis, and has a recessed part 211a, a recessed part 211b, and a recessed part 211c wherein the recessed part 211a opens in the upper surface of the base 21, the recessed part 211b opens in a bottom surface of the recessed part 211a and is smaller in opening width than the recessed part 211a, and the recessed part 211c opens in a bottom surface of the recessed part 211b and is smaller in opening width than the recessed part 211b. Further, to the bottom surface of the recessed part 211a, there is fixed the support substrate 4 in a state of supporting the vibrator element 6, and to the bottom surface of the recessed part 211c, there is fixed the circuit element 3.

Further, as shown in FIG. 2, in the internal space S, the vibrator element 6, the support substrate 4, and the circuit element 3 are disposed so as to overlap each other in a plan view. In other words, the vibrator element 6, the support substrate 4, and the circuit element 3 are arranged along the C axis. Thus, it is possible to suppress the planar spread towards the directions along the A axis and the B axis of the package 2, and thus, it is possible to achieve reduction in size of the vibrator device 1. Further, the support substrate 4 is located between the vibrator element 6 and the circuit element 3, and supports the vibrator element 6 so as to hold the vibrator element 6 from the lower side, namely the negative side of the C axis.

Further, as shown in FIG. 1 and FIG. 2, on the bottom surface of the recessed part 211a, there is disposed a plurality of internal terminals 241, on the bottom surface of the recessed part 211b, there is disposed a plurality of internal terminals 242, and on the lower surface of the base 21, there is disposed a plurality of external terminals 243. The internal terminals 241, 242 and the external terminals 243 described above are electrically coupled via interconnections not shown formed inside the base 21 in accordance with the circuit design. Further, the internal terminals 241 are electrically coupled to the vibrator element 6 via bonding members B1, B2 having electrical conductivity and the support substrate 4, and the internal terminals 242 are electrically coupled to the circuit element 3 via bonding wires BW.

The vibrator element 6 is an angular velocity sensor element capable of detecting the angular velocity ωc defining the C axis as the detection axis as the physical quantity sensor element. As shown in FIG. 3, the vibrator element 6 has a vibrating substrate 7, and electrodes 8 disposed on a surface of the vibrating substrate 7. The vibrating substrate 7 is formed of a Z-cut quartz crystal substrate. The Z-cut quartz crystal substrate has spread in an X-Y plane defined by an X axis as the electrical axis and a Y axis as the mechanical axis, and has a thickness in a direction along a Z axis as an optical axis, the electrical axis, the mechanical axis, and the optical axis being crystal axes of the quartz crystal.

The vibrating substrate 7 has a base member 70, a pair of detection arms 71, 72, a pair of coupling arms 73, 74, a pair of drive arms 75, 76, and a pair of drive arms 77, 78, wherein the base member 70 is located in a central portion, the pair of detection arms 71, 72 extend toward both sides in a direction along the B axis from the base member 70, the pair of coupling arms 73, 74 extend toward both sides in a direction along the A axis from the base member 70, the pair of drive arms 75, 76 extend toward both sides in a direction along the B axis from a tip of the coupling arm 73, and the pair of drive arms 77, 78 extend toward both sides in a direction along the B axis from a tip of the coupling arm 74. By using the vibrating substrate 7 having such a shape, the vibrator element 6 having excellent vibration balance is obtained.

Further, as shown in FIG. 4 and FIG. 5, the drive arms 75 through 78 each have a groove opening in the upper surface and a groove opening in the lower surface to form a roughly H-shaped cross-sectional shape. It should be noted that regarding the detection arms 71, 72, it is possible to provide a groove opening in the upper surface and a groove opening in the lower surface to form a roughly H-shaped cross-sectional shape.

As shown in FIG. 3, the electrodes 8 include a drive signal electrode 81, a drive ground electrode 82, a first detection signal electrode 83 as a detection signal electrode, a first detection ground electrode 84, a second detection signal electrode 85 as a detection signal electrode, and a second detection ground electrode 86.

The drive signal electrode 81 is disposed on both the side surfaces of each of the drive arms 75, 76, and the upper surface and the lower surface of each of the drive arms 77, 78. Meanwhile, the drive ground electrode 82 is disposed on the upper surface and the lower surface of each of the drive arms 75, 76, and both the side surfaces of each of the drive arms 77, 78. Further, the first detection signal electrode 83 is disposed on the upper surface and the lower surface of the detection arm 71, and the first detection ground electrode 84 is disposed on both the side surfaces of the detection arm 71. Meanwhile, the second detection signal electrode 85 is disposed on the upper surface and the lower surface of the detection arm 72, and the second detection ground electrode 86 is disposed on both the side surfaces of the detection arm 72.

Further, these electrodes 81 through 86 are each laid around to the lower surface of the base member 70. Further, as shown in FIG. 3, on the lower surface of the base member 70, there are disposed a terminal 701 electrically coupled to the drive signal electrode 81, a terminal 702 electrically coupled to the drive ground electrode 82, a terminal 703 electrically coupled to the first detection signal electrode 83, a terminal 704 electrically coupled to the first detection ground electrode 84, a terminal 705 electrically coupled to the second detection signal electrode 85, and a terminal 706 electrically coupled to the second detection ground electrode 86.

Such a vibrator element 6 detects the angular velocity ωc in the following manner. Firstly, when applying a drive signal between the drive signal electrode 81 and the drive ground electrode 82, the drive arms 75 through 78 flexurally vibrate as represented by the arrows shown in FIG. 6. Hereinafter, this drive mode is referred to as a drive vibration mode. Further, when the angular velocity ωc is applied to the vibrator element 6 in the state of performing the drive in the drive vibration mode, a detection vibration mode shown in FIG. 7 is newly excited. In the detection vibration mode, a Coriolis force acts on the drive arms 75 through 78 to excite the vibration in a direction represented by the arrows b, and in concert with this vibration, the detection vibration due to the flexural vibration occurs in a direction represented by the arrows a in the detection arms 71, 72. A charge generated in the detection arm 71 due to such a detection vibration mode is taken out between the first detection signal electrode 83 and the first detection ground electrode 84 as a first detection signal, a charge generated in the detection arm 72 is taken out between the second detection signal electrode 85 and the second detection ground electrode 86 as a second detection signal, and it is possible to detect the angular velocity ωc based on these first and second detection signals.

Going back to FIG. 1, the circuit element 3 is fixed to the bottom surface of the recessed part 211c. The circuit element 3 includes a drive circuit and a detection circuit for driving the vibrator element 6 to detect the angular velocity ωc applied to the vibrator element 6. It should be noted that the circuit element 3 is not particularly limited, and can include other circuits such as a temperature compensation circuit.

Further, as shown in FIG. 1, the support substrate 4 intervenes between the base 21 and the vibrator element 6. The support substrate 4 mainly has a function of absorbing or relaxing the stress caused by a deformation of the base 21 to thereby make it difficult for the stress to reach the vibrator element 6.

Such a support substrate 4 is provided with a gimbal structure. As shown in FIG. 2 and FIG. 8, in the plan view from the direction along the C axis, the support substrate 4 has an element mounting base 41, a supporting base 42, a frame 43, inner beams 440, and outer beams 450 wherein the vibrator element 6 is mounted on the element mounting base 41, the supporting base 42 is located outside the element mounting base 41, fixed to the base 21, and is shaped like a frame, the frame 43 is located between the element mounting base 41 and the supporting base 42, and forms a frame-like shape surrounding the element mounting base 41, the inner beams 440 are provided with a pair of first beams 441, 442 which extend toward both sides in the direction along the A axis as a first direction from the element mounting base 41 to couple the element mounting base 41 and the frame 43 to each other, and the outer beams 450 are provided with a pair of second beams 451, 452 which extend toward both sides in the direction along the B axis as a second direction from the frame 43 to couple the frame 43 and the supporting base 42 to each other.

It should be noted that in the plan view in the direction along the C axis, an imaginary straight line which passes through the center O of the element mounting base 41 and is parallel to the A axis is hereinafter defined as an imaginary straight line La, and an imaginary straight line which passes through the center O and is parallel to the B axis is hereinafter defined as an imaginary straight line Lb. The element mounting base 41, the supporting base 42, the frame 43, the pair of first beams 441, 442, and the pair of second beams 451, 452 are all arranged line-symmetrically about the imaginary straight line La, and at the same time, arranged line-symmetrically about the imaginary straight line Lb. It should be noted that the shape of the support substrate 4 is not limited thereto.

The frame 43 is shaped like a rectangular frame, and has a pair of edge parts 431, 432 extending in a direction along the A axis, and a pair of edge parts 433, 434 extending in a direction along the B axis. Similarly, the supporting base 42 is shaped like a rectangular frame, and has a pair of edge parts 421, 422 extending in a direction along the A axis, and a pair of edge parts 423, 424 extending in a direction along the B axis. In particular, in the present embodiment, in the plan view in the direction along the C axis, the edge part 433 of the frame 43 overlaps the drive arms 75, 76 of the vibrator element 6, and the edge part 434 of the frame 43 overlaps the drive arms 77, 78 of the vibrator element 6.

Further, the pair of first beams 441, 442 are respectively located on both sides in a direction along the A axis of the element mounting base 41, and couple the element mounting base 41 and the frame 43 to each other so as to achieve the both ends support of the element mounting base 41. Further, the pair of first beams 441, 442 are each arranged on a straight line along the imaginary straight line La. In other words, the first beam 441 couples the element mounting base 41 and a central portion in the extending direction of the edge part 433 to each other, and the first beam 442 couples the element mounting base 41 and a central portion in the extending direction of the edge part 434 of the frame 43 to each other. It should be noted that this is not a limitation, and for example, it is possible for the first beams 441, 442 to be arranged so as to be shifted in a direction along the B axis from each other.

Further, the pair of second beams 451, 452 are respectively located on both sides in a direction along the B axis of the frame 43, and couple the frame 43 and the supporting base 42 to each other so as to achieve the both ends support of the frame 43. Further, the pair of second beams 451, 452 are each arranged on a straight line along the imaginary straight line Lb. In other words, the second beam 451 couples central portions in the extending direction of the edge parts 431, 421 to each other, and the second beam 452 couples central portions in the extending direction of the edge parts 432, 422 to each other. It should be noted that this is nota limitation, and for example, it is possible for the second beams 451, 452 to be arranged so as to be shifted in a direction along the A axis from each other.

By making the extending direction of the first beams 441, 442 and the extending direction of the second beams 451, 452 perpendicular to each other as described above, it is possible to effectively absorb or relax the stress with the support substrate 4. Further, by extending the first beams 441, 442 in a direction along the A axis which is the same direction as the extending direction of the coupling arms 73, 74, it is possible to easily ensure an equivalent length to those of the coupling arms 73, 74. Therefore, it is possible to make the first beams 441, 442 sufficiently long, and the stress relaxing effect described above is further enhanced. In particular, as described above, in the present embodiment, in the plan view in the direction along the C axis, the edge part 433 of the frame 43 overlaps the drive arms 75, 76, and the edge part 434 of the frame 43 overlaps the drive arms 77, 78, and therefore, the length of the first beams 441, 442 is roughly equal to the length of the coupling arms 73, 74.

In such a support substrate 4, the base member 70 of the vibrator element 6 is fixed to an upper surface of the element mounting base 41 via the six bonding members B2 having electrical conductivity, and the edge parts 423, 424 of the supporting base 42 are fixed to the bottom surface of the recessed part 211a via the six bonding members B1 having electrical conductivity. More specifically, the edge part 423 of the supporting base 42 is fixed to the bottom surface of the recessed part 211a via the three bonding members B1 having electrical conductivity, and the edge part 424 of the supporting base 42 is fixed to the bottom surface of the recessed part 211a via the three bonding members B1 having electrical conductivity. By making the support substrate 4 intervene between the vibrator element 6 and the base 21 as described above, it is possible to absorb or relax the stress transmitted from the base 21 due to the support substrate 4, and thus, it becomes difficult for the stress to reach the vibrator element 6. Therefore, it is possible to effectively prevent the degradation and the fluctuation of the vibration characteristics of the vibrator element 6.

It should be noted that the bonding members B1, B2 are not particularly limited as long as both of the electrical conductivity and the bonding property are provided, and it is possible to use, for example, a variety of metal bumps such as gold bumps, silver bumps, copper bumps, or solder bumps, or an electrically conductive adhesive having an electrically conductive filler such as a silver filler dispersed in a variety of adhesives such as a polyimide type adhesive, an epoxy type adhesive, a silicone type adhesive, or an acrylic adhesive. When using the metal bumps which are in the former group as the bonding members B1, B2, it is possible to suppress generation of a gas from the bonding members B1, B2, and it is possible to effectively prevent a change in environment, in particular rise in pressure, of the internal space S. On the other hand, when using the electrically conductive adhesive which is in the latter group as the bonding members B1, B2, the bonding members B1, B2 become relatively soft, and it is possible to absorb or relax the stress described above also in the bonding members B1, B2.

In the present embodiment, the electrically conductive adhesive is used as the bonding members B1, and the metal bumps are used as the bonding members B2. By using the electrically conductive adhesive as the bonding members B1 for bonding the support substrate 4 and the base 21 as materials different in type from each other, the thermal stress caused by a difference in thermal expansion coefficient therebetween can efficiently be absorbed or relaxed by the bonding members B1. On the other hand, since the support substrate 4 and the vibrator element 6 are bonded to each other with six bonding members B2 disposed in a relatively small area, by using the metal bumps as the bonding members B2, wetting spread which occurs in the case of the electrically conductive adhesive is prevented, and thus, it is possible to effectively prevent the bonding members B2 from having contact with each other.

Such a support substrate 4 is formed of a quartz crystal substrate. By forming the support substrate 4 of the quartz crystal substrate similarly to the vibrating substrate 7 as described above, it is possible to make the support substrate 4 and the vibrating substrate 7 equal in thermal expansion coefficient to each other. Therefore, the thermal stress caused by the difference in thermal expansion coefficient from each other does not substantially occur between the support substrate 4 and the vibrating substrate 7, and it becomes more difficult for the vibrator element 6 to be subjected to stress. Therefore, it is possible to more effectively prevent the degradation and the fluctuation of the vibration characteristics of the vibrator element 6.

In particular, the support substrate 4 is formed of the quartz crystal substrate with the same cutting angle as that in the vibrating substrate 7 provided to the vibrator element 6. In the present embodiment, since the vibrating substrate 7 is formed of a Z-cut quartz crystal substrate, the support substrate 4 is also formed of the Z-cut quartz crystal substrate. Further, the directions of the crystal axes of the support substrate 4 coincide with the directions of the crystal axes of the vibrating substrate 7. In other words, the support substrate 4 and the vibrating substrate 7 coincide with each other in the X axis, the Y axis, and the Z axis. Since the quartz crystal is different in thermal expansion coefficient between the direction along the X axis, the direction along the Y axis, and the direction along the Z axis, by making the support substrate 4 and the vibrating substrate 7 the same in cutting angle to uniform the directions of the crystal axes, it becomes more difficult for the thermal stress described above to occur between the support substrate 4 and the vibrating substrate 7. Therefore, it becomes more difficult for the vibrator element 6 to be subjected to the stress, and thus, it is possible to more effectively prevent the degradation and the fluctuation of the vibration characteristics of the vibrator element 6.

It should be noted that the support substrate 4 is not limited thereto, but can also be different in directions of the crystal axes from the vibrating substrate 7 although the same in cutting angle as the vibrating substrate 7. Further, the support substrate 4 can also be formed of a quartz crystal substrate different in cutting angle from the vibrating substrate 7. Further, the support substrate 4 is not required to be formed of the quartz crystal substrate, and in this case, the support substrate 4 can be formed of, for example, a silicon substrate or a resin substrate. In this case, it is preferable for the constituent material of the support substrate 4 to be a material having a difference in thermal expansion coefficient from the quartz crystal smaller than a difference in thermal expansion coefficient between the quartz crystal and the constituent material of the base 21.

Further, as shown in FIG. 8, on the support substrate 4, there are disposed a plurality of interconnections 9 for electrically coupling the electrodes 81 through 86 of the vibrator element 6 and the internal terminals 241 to each other. The plurality of interconnections 9 includes a drive signal interconnection 91, a drive ground interconnection 92, a first detection signal interconnection 93 as a detection signal interconnection, a first detection ground interconnection 94, a second detection signal interconnection 95 as the detection signal interconnection, and a second detection ground interconnection 96. Further, these interconnections 91 through 96 are each laid around to the element mounting base 41 and the supporting base 42 through the inner beam 440, the frame 43, and the outer beam 450.

Further, the drive signal interconnection 91 is electrically coupled to the terminal 701, namely the drive signal electrode 81, via the bonding member B2 in the end part on the element mounting base 41, and is electrically coupled to the internal terminal 241 via the bonding member B1 in the end part on the supporting base 42. Further, the drive ground interconnection 92 is electrically coupled to the terminal 702, namely the drive ground electrode 82, via the bonding member B2 in the end part on the element mounting base 41, and is electrically coupled to the internal terminal 241 via the bonding member B1 in the end part on the supporting base 42.

Further, the first detection signal interconnection 93 is electrically coupled to the terminal 703, namely the first detection signal electrode 83, via the bonding member B2 in the end part on the element mounting base 41, and is electrically coupled to the internal terminal 241 via the bonding member B1 in the end part on the supporting base 42. Further, the first detection ground interconnection 94 is electrically coupled to the terminal 704, namely the first detection ground electrode 84, via the bonding member B2 in the end part on the element mounting base 41, and is electrically coupled to the internal terminal 241 via the bonding member B1 in the end part on the supporting base 42.

Further, the second detection signal interconnection 95 is electrically coupled to the terminal 705, namely the second detection signal electrode 85, via the bonding member B2 in the end part on the element mounting base 41, and is electrically coupled to the internal terminal 241 via the bonding member B1 in the end part on the supporting base 42. Further, the second detection ground interconnection 96 is electrically coupled to the terminal 706, namely the second detection ground electrode 86, via the bonding member B2 in the end part on the element mounting base 41, and is electrically coupled to the internal terminal 241 via the bonding member B1 in the end part on the supporting base 42.

Thus, the vibrator element 6 and the circuit element 3 are electrically coupled to each other via these interconnections 91 through 96.

As shown in FIG. 8, the drive signal interconnection 91, the first detection ground interconnection 94, and the second detection ground interconnection 96 out of the six interconnections 91 through 96 are each laid around to the supporting base 42 from the element mounting base 41 through the first beam 441, the frame 43, and the second beam 451. More particularly, the drive signal interconnection 91, the first detection ground interconnection 94, and the second detection ground interconnection 96 are each laid around to the edge part 423 of the supporting base 42 from the element mounting base 41 through the first beam 441, the edge parts 433, 431 of the frame 43, the second beam 451, and the edge part 421 of the supporting base 42. Further, these three interconnections 91, 94, and 96 are laid around in parallel to each other and in an insulated state in an arrangement in which the first detection ground interconnection 94 and the second detection ground interconnection 96 are located on both sides of the drive signal interconnection 91, in other words, in an arrangement in which the drive signal interconnection 91 is located between the first detection ground interconnection 94 and the second detection ground interconnection 96.

The drive ground interconnection 92, the first detection signal interconnection 93, and the second detection signal interconnection 95 as the rest of the interconnections are each laid around to the supporting base 42 from the element mounting base 41 through the first beam 442, the frame 43, and the second beam 452. More particularly, the drive ground interconnection 92, the first detection signal interconnection 93, and the second detection signal interconnection 95 are each laid around to the edge part 424 of the supporting base 42 from the element mounting base 41 through the first beam 442 extending in an opposite direction to the first beam 441, the edge parts 434, 432 of the frame 43, the second beam 452, and the edge part 422 of the supporting base 42. Further, these three interconnections 92, 93, and 95 are laid around in parallel to each other and in an insulated state in an arrangement in which the first detection signal interconnection 93 and the second detection signal interconnection 95 are located on both sides of the drive ground interconnection 92, in other words, in an arrangement in which the drive ground interconnection 92 is located between the first detection signal interconnection 93 and the second detection signal interconnection 95.

Here, when focusing attention on the drive ground interconnection 91, the first detection signal interconnection 93, and the second detection signal interconnection 95, the drive signal interconnection 91 is laid around to the supporting base 42 from the element mounting base 41 through the first beam 441, the frame 43, and the second beam 451. On the other hand, the first and second detection signal interconnections 93, 95 are laid around to the supporting base 42 from the element mounting base 41 through the first beam 442, the frame 43, and the second beam 452. In other words, the drive signal interconnection 91 and the first and second detection signal interconnections 93, 95 are laid around to the element mounting base 41 and the supporting base 42 passing through the respective inner beams 440 different from each other, and further passing through the respective outer beams 450 different from each other. In other words, when dividing the support substrate 4 into four areas by the imaginary straight lines La, Lb as boundaries in the plan view, the interconnection path of the drive signal interconnection 91 and the interconnection path of the first detection signal interconnection 93 and the second detection signal interconnection 95 respectively pass through the areas located on the diagonal positions with respect to the center O.

Therefore, the drive signal interconnection 91 and the first and second detection signal interconnections 93, 95 are disposed with a sufficient distance on the support substrate 4, and it becomes difficult for the drive signal interconnection 91 and the first and second detection signal interconnections 93, 95 to interfere with each other. Therefore, it becomes difficult for the noise caused by the influence of the drive signal applied to the drive signal interconnection 91 to mix in the first and second detection signal interconnections 93, 95, and it is possible to prevent the deterioration of the S/N ratio of the first and second detection signals output from the first and second detection signal interconnections 93, 95. Therefore, it is possible to effectively prevent the degradation of the detection accuracy of the angular velocity ωc.

In particular, as described above, the drive signal interconnection 91 passes through the edge parts 433, 431 of the frame 43, and the first and second detection signal interconnections 93, 95 pass through the edge parts 432, 434 of the frame 43. Therefore, the drive signal interconnection 91 and the first and second detection signal interconnections 93, 95 are also disposed with a sufficient distance on the frame 43. Therefore, it also becomes difficult for the drive signal interconnection 91 and the first and second detection signal interconnections 93, 95 to interfere with each other on the frame 43. As a result, it becomes difficult for the noise caused by an influence of the drive signal applied to the drive signal interconnection 91 to mix in the first and second detection signal interconnections 93, 95, and it is possible to effectively suppress the deterioration of the detection accuracy of the angular velocity ωc.

Further, as described above, the drive signal interconnection 91 is laid around to the edge part 423 through the edge part 421 of the supporting base 42, and the first and second detection signal interconnections 93, 95 are laid around to the edge part 424 through the edge part 422 of the supporting base 42. Therefore, the drive signal interconnection 91 and the first and second detection signal interconnections 93, 95 are also disposed with a sufficient distance on the supporting base 42. Therefore, it also becomes difficult for the drive signal interconnection 91 and the first and second detection signal interconnections 93, 95 to interfere with each other on the supporting base 42. As a result, it becomes difficult for the noise caused by an influence of the drive signal applied to the drive signal interconnection 91 to mix in the first and second detection signal interconnections 93, 95, and it is possible to effectively suppress the deterioration of the detection accuracy of the angular velocity ωc.

Further, in the present embodiment, as described above, the first and second detection ground interconnections 94, 96 are located on both the sides of the drive signal interconnection 91. Therefore, the first and second detection ground interconnections 94, 96 function as a shield, and thus, it becomes further difficult for the noise caused by the influence of the drive signal applied to the drive signal interconnection 91 to mix in the first and second detection signal interconnections 93, 95.

The vibrator device 1 is hereinabove described. As described above, such a vibrator device 1 has the vibrator element 6, the support substrate 4 supporting the vibrator element 6, and the plurality of interconnections 9 disposed on the support substrate 4. Further, the vibrator element 6 has the drive arms 75, 76, 77, and 78 and the detection arms 71, 72 wherein the drive arms 75, 76, 77, and 78 are provided with the drive signal electrode 81, and perform the drive vibration in response to application of the drive signal to the drive signal electrode 81, and the detection arms 71, 72 have the first and second detection signal electrodes 83, 85 as the detection signal electrodes, and perform the detection vibration in response to the angular velocity ωc as the physical quantity of the detection target to thereby output the first and second detection signals as the detection signals from the first and second detection signal electrodes 83, 85. Further, in the plan view from the direction along the C axis as the thickness direction of the support substrate 4, the support substrate 4 has the element mounting base 41, the supporting base 42, the frame 43, the inner beams 440, and the outer beams 450 wherein the vibrator element 6 is mounted on the element mounting base 41, the supporting base 42 is located outside the element mounting base 41, the frame 43 is located between the element mounting base 41 and the supporting base 42, and forms a frame-like shape surrounding the element mounting base 41, the inner beams 440 are provided with the pair of first beams 441, 442 which extend toward both the sides in the direction along the A axis as the first direction from the element mounting base 41 to couple the element mounting base 41 and the frame 43 to each other, and the outer beams 450 are provided with the pair of second beams 451, 452 which extend toward both the sides in the direction along the B axis as the second direction different from the direction along the A axis from the frame 43 to couple the frame 43 and the supporting base 42 to each other. Further, the plurality of interconnections 9 includes the drive signal interconnection 91 and the first and second detection signal interconnections 93, 95 as the detection signal interconnections wherein the drive signal interconnection 91 is electrically coupled to the drive signal electrode 81, and the detection signal interconnections 93, 95 are electrically coupled to the first and second detection signal electrodes 83, 85 and are laid around to the element mounting base 41 and the supporting base 42. Further, the drive signal interconnection 91 and the first and second detection signal interconnections 93, 95 are laid around to the element mounting base 41 and the frame 43 passing through the respective inner beams 440 different from each other, and further laid around to the frame 43 and the supporting base 42 passing through the respective outer beams 450 different from each other.

By adopting such a configuration, the drive signal interconnection 91 and the first and second detection signal interconnections 93, 95 are disposed with a sufficient distance on the support substrate 4, and it becomes difficult for the drive signal interconnection 91 and the first and second detection signal interconnections 93, 95 to interfere with each other. Therefore, it becomes difficult for the noise caused by the influence of the drive signal applied to the drive signal interconnection 91 to mix in the first and second detection signal interconnections 93, 95, and it is possible to prevent the deterioration of the S/N ratio of the first and second detection signals output from the first and second detection signal interconnections 93, 95. Therefore, it is possible to effectively prevent the degradation of the detection accuracy of the angular velocity ωc.

Further, as described above, when defining the three axes perpendicular to each other as the A axis, the B axis, and the C axis, the thickness direction of the support substrate 4 is parallel to the C axis, and the vibrator element 6 has the base member 70 fixed to the element mounting base 41, the pair of detection arms 71, 72 extending toward both the sides along the B axis from the base member 70, the pair of coupling arms 73, 74 extending toward both the sides along the A axis from the base member 70, the pair of drive arms 75, 76 extending toward both the sides along the B axis from the tip of the one coupling arm 73, and the pair of drive arms 77, 78 extending toward both the sides along the B axis from the tip of the other coupling arm 74. By adopting such a configuration, there is achieved the vibrator element 6 which is excellent in vibration balance, and has a high angular velocity detection characteristic.

Further, as described above, the first direction in which the first beams 441, 442 extend is the direction along the A axis, and the second direction in which the second beams 451, 452 extend is the direction along the B axis. Thus, the extending direction of the first beams 441, 442 and the extending direction of the second beams 451, 452 become perpendicular to each other, and thus, it is possible to effectively absorb or relax the stress with the support substrate 4. Further, by extending the first beams 441, 442 in a direction along the A axis which is the same direction as the extending direction of the coupling arms 73, 74, it is possible to easily ensure an equivalent length to those of the coupling arms 73, 74.

Second Embodiment

Figure 9:
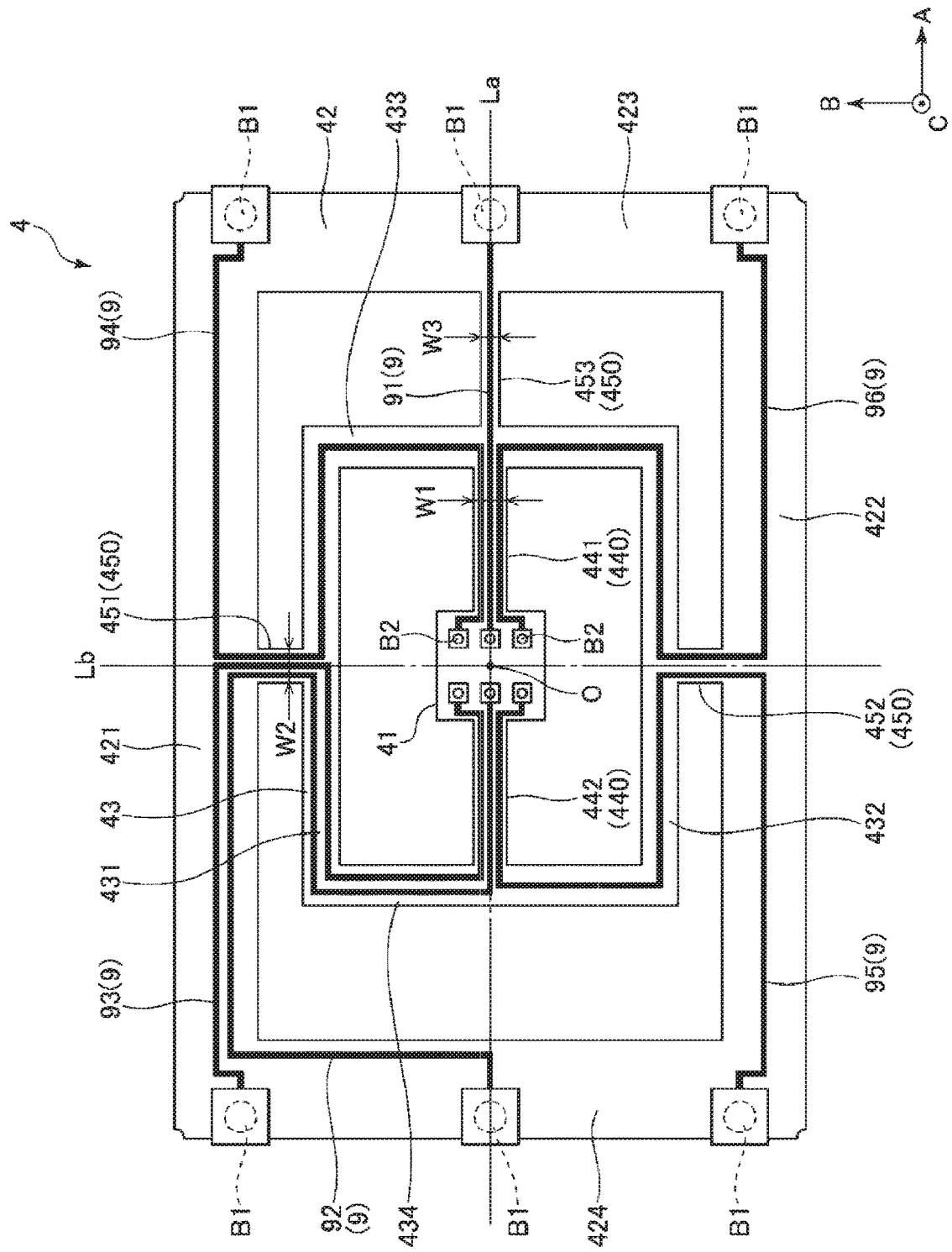
FIG. 9 is a plan view showing a support substrate provided to a vibrator device according to a second embodiment.
Figure 10:
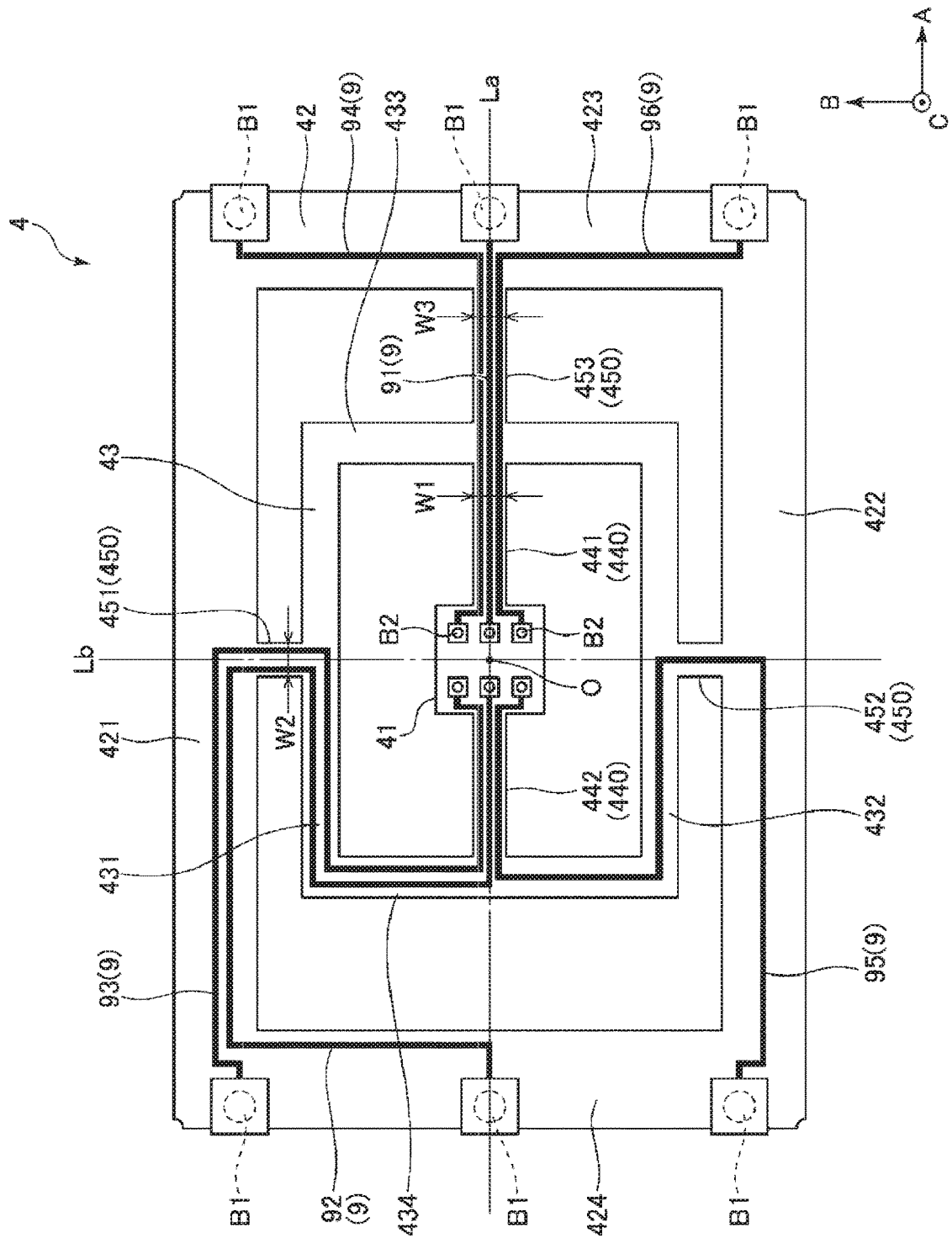
FIG. 10 is a plan view showing a modified example of the support substrate shown in FIG. 9.

FIG. 9 is a plan view showing a support substrate provided to a vibrator device according to a second embodiment. FIG. 10 is a plan view showing a modified example of the support substrate shown in FIG. 9.

The present embodiment is substantially the same as the first embodiment described above except the point that the configuration of the support substrate 4 is different. It should be noted that in the following description, the present embodiment will be described with a focus on the difference from the first embodiment described above, and the description of substantially the same issues will be omitted. Further, in FIG. 9, the constituents substantially the same as those of the first embodiment described above are denoted by the same reference symbols.

As shown in FIG. 9, in the support substrate 4 in the present embodiment, the outer beams 450 are further provided with a third beam 453 in addition to the configuration in the first embodiment described above. The third beam 453 mainly has a function of making it easy to lay around the interconnections 9. It should be noted that when making the width W3 of the third beam 453 excessively large, the degree of freedom of the frame 43 with respect to the supporting base 42 decreases to make the stress easy to reach the vibrator element 6 from the base 21, and thus, there is a possibility that the degradation of the sensitivity of the vibrator element 6 is incurred. Therefore, the width W3 of the third beam 453 is not particularly limited, but is preferably no larger than the width W1 of the first beams 441, 442 and the width W2 of the second beams 451, 452. In other words, W3<W1 and W3<W2 are preferably fulfilled.

The third beam 453 extends from the frame 43 toward the positive side of the A axis to couple the frame 43 and the supporting base 42 to each other. Further, the third beam 453 is disposed along the imaginary straight line La. In other words, the third beam 453 is disposed in alignment with the pair of first beams 441, 442, and couples central portions in the extending direction of the edge parts 433, 423 to each other. By providing such an arrangement to the third beam 453, it is possible to more effectively prevent the decrease in the degree of freedom of the frame 43 with respect to the supporting base 42.

Further, the drive signal interconnection 91 is laid around to the supporting base 42 from the element mounting base 41 through the first beam 441, the frame 43, and the third beam 453. By laying around the drive signal interconnection 91 through the third beam 453 as described above, it becomes easy to lay around the drive signal interconnection 91. Further, it is possible to shorten the wiring length of the drive signal interconnection 91 compared to the first embodiment described above. Further, since the number of the interconnections 9 passing through the second beams 451, 452 decreases from six to five compared to the first embodiment described above, it becomes easy to lay around the interconnections 9 on the second beams 451, 452. In particular, in the present embodiment, since the third beam 453 is disposed in alignment with the pair of first beams 441, 442, it is possible to dispose the drive signal interconnection 91 on a straight line, and it is possible to make the wiring length of the drive signal interconnection 91 shorter.

Further, the first detection ground interconnection 94 is laid around to the supporting base 42 from the element mounting base 41 through the first beam 441, the frame 43, and the second beam 451. Further, the second detection ground interconnection 96 is laid around to the supporting base 42 from the element mounting base 41 through the first beam 441, the frame 43, and the second beam 452. Further, the drive ground interconnection 92 and the first detection signal interconnection 93 are each laid around to the supporting base 42 from the element mounting base 41 through the first beam 442, the frame 43, and the second beam 451. Further, the second detection signal interconnection 95 is laid around to the supporting base 42 from the element mounting base 41 through the first beam 442, the frame 43, and the second beam 452.

According also to such an arrangement of the interconnections 91 through 96, the drive signal interconnection 91 and the first and second detection signal interconnections 93, 95 are laid around to the element mounting base 41 and the frame 43 passing through the respective inner beams 440 different from each other, and further laid around to the frame 43 and the supporting base 42 passing through the respective outer beams 450 different from each other. Therefore, the drive signal interconnection 91 and the first and second detection signal interconnections 93, 95 are disposed with a sufficient distance, and it becomes difficult for the drive signal interconnection 91 and the first and second detection signal interconnections 93, 95 to interfere with each other. Therefore, it becomes difficult for the noise caused by an influence of the drive signal applied to the drive signal interconnection 91 to mix in the first and second detection signal interconnections 93, 95, and it is possible to effectively suppress the deterioration of the detection accuracy of the angular velocity ωc.

In particular, in the present embodiment, since only the drive signal interconnection 91, namely one of the interconnections 9 alone, is made to pass through the third beam 453, it is possible to make the width W3 of the third beam 453 smaller. Therefore, the decrease in the degree of freedom of the frame 43 with respect to the supporting base 42 is prevented, and it becomes difficult for the stress to reach the vibrator element 6 from the base 21. It should be noted that the number of the interconnections 9 passing through the third beam 453 is not particularly limited, but is preferably no larger than two, and is more preferably one as in the case of the present embodiment. Thus, it is possible to make the width W3 of the third beam 453 smaller.

As described above, in the vibrator device 1 according to the present embodiment, the outer beams 450 includes the third beam 453 which extends from the frame 43 to couple the frame 43 and the supporting base 42 to each other. Further, one of the drive signal interconnection 91 and the first and second detection signal interconnections 93, 95, for example, the drive signal interconnection 91 in the present embodiment, is laid around to the frame 43 and the supporting base 42 through the third beam 453. By laying around the drive signal interconnection 91 through the third beam 453 as described above, it becomes easy to lay around the drive signal interconnection 91. Further, it is possible to shorten the wiring length of the drive signal interconnection 91 compared to the first embodiment described above. Further, since the number of the interconnections 9 passing through the second beams 451, 452 decreases from six to five compared to the first embodiment described above, it becomes easy to lay around the interconnections 9 on the second beams 451, 452.

Further, as described above, in the plan view from the direction along the C axis, the third beam 453 extends in the direction along the A axis, and is located in alignment with the first beams 441, 442. Thus, it is possible to make the wiring length of the drive signal interconnection 91 shorter. Further, it is possible to more effectively prevent the decrease in the degree of freedom of the frame 43 with respect to the supporting base 42 due to the third beam 453.

Further, as described above, the number of the interconnections 9 passing through the third beam 453 is no larger than two. In particular, in the present embodiment, the number of the interconnections 9 passing through the third beam 453 is one. Thus, it is possible to make the width W3 of the third beam 453 smaller.

According also to such a second embodiment as described above, substantially the same advantages as in the first embodiment described above can be exerted.

It should be noted that the wiring pattern of the interconnections 91 through 96 is not particularly limited providing the drive signal interconnection 91 and the first and second detection signal interconnections 93, 95 are laid around to the element mounting base 41 and the supporting base 42 through the respective inner beams 440 different from each other and the respective outer beams 450 different from each other. For example, as shown in FIG. 10, it is also possible for at least one of the first and second detection ground interconnections 94, 96, the both thereof in the illustrated configuration, to be laid around to the supporting base 42 from the element mounting base 41 through the first beam 441, the frame 43, and the third beam 453 besides the drive signal interconnection 91.

Further, the arrangement of the third beam 453 is not particularly limited. For example, it is possible for the third beam 453 to extend along the A axis at a position shifted from the imaginary straight line La, or to extend in a direction different from the direction along the A axis.

Third Embodiment

Figure 11:
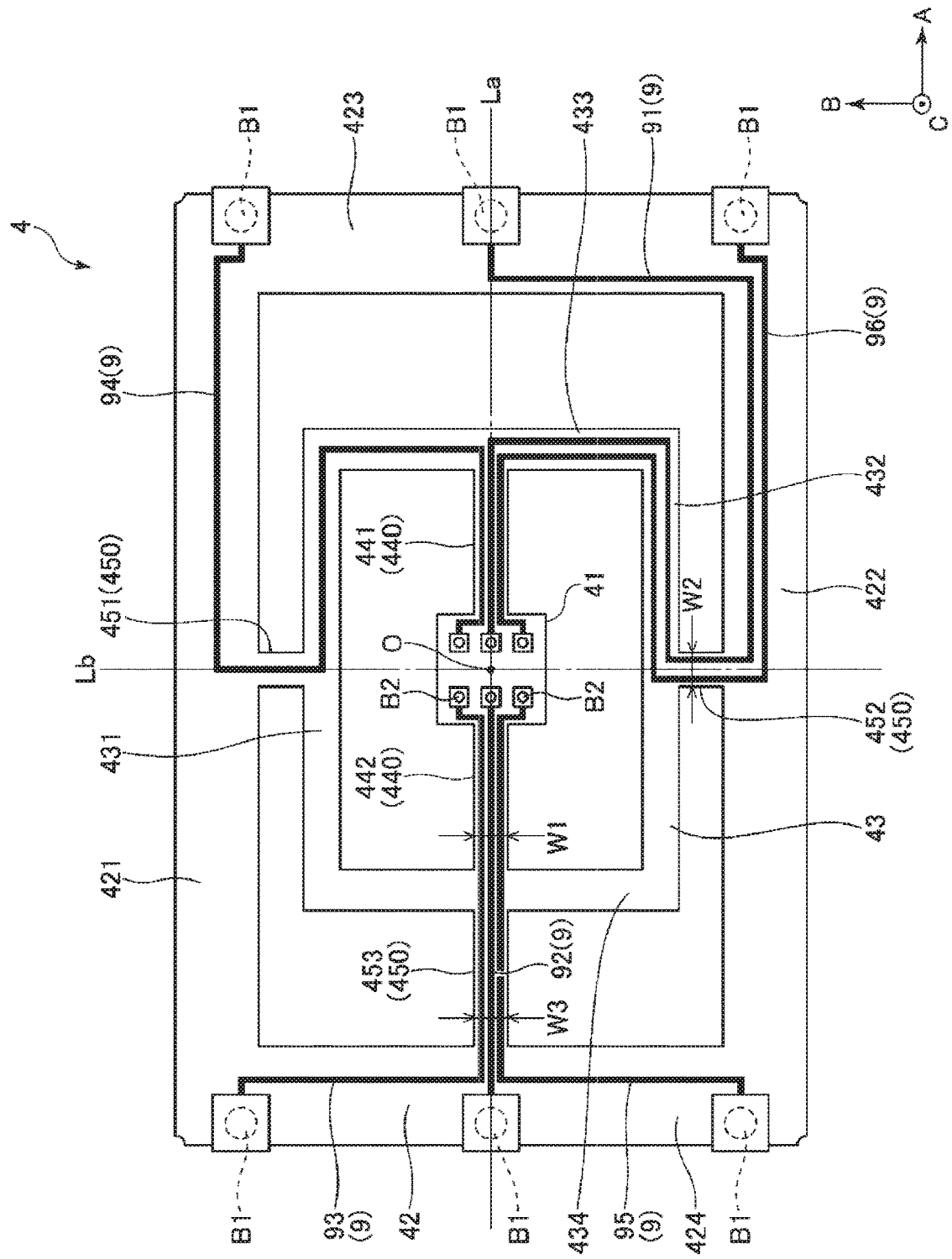
FIG. 11 is a plan view showing a support substrate provided to a vibrator device according to a third embodiment.
Figure 12:
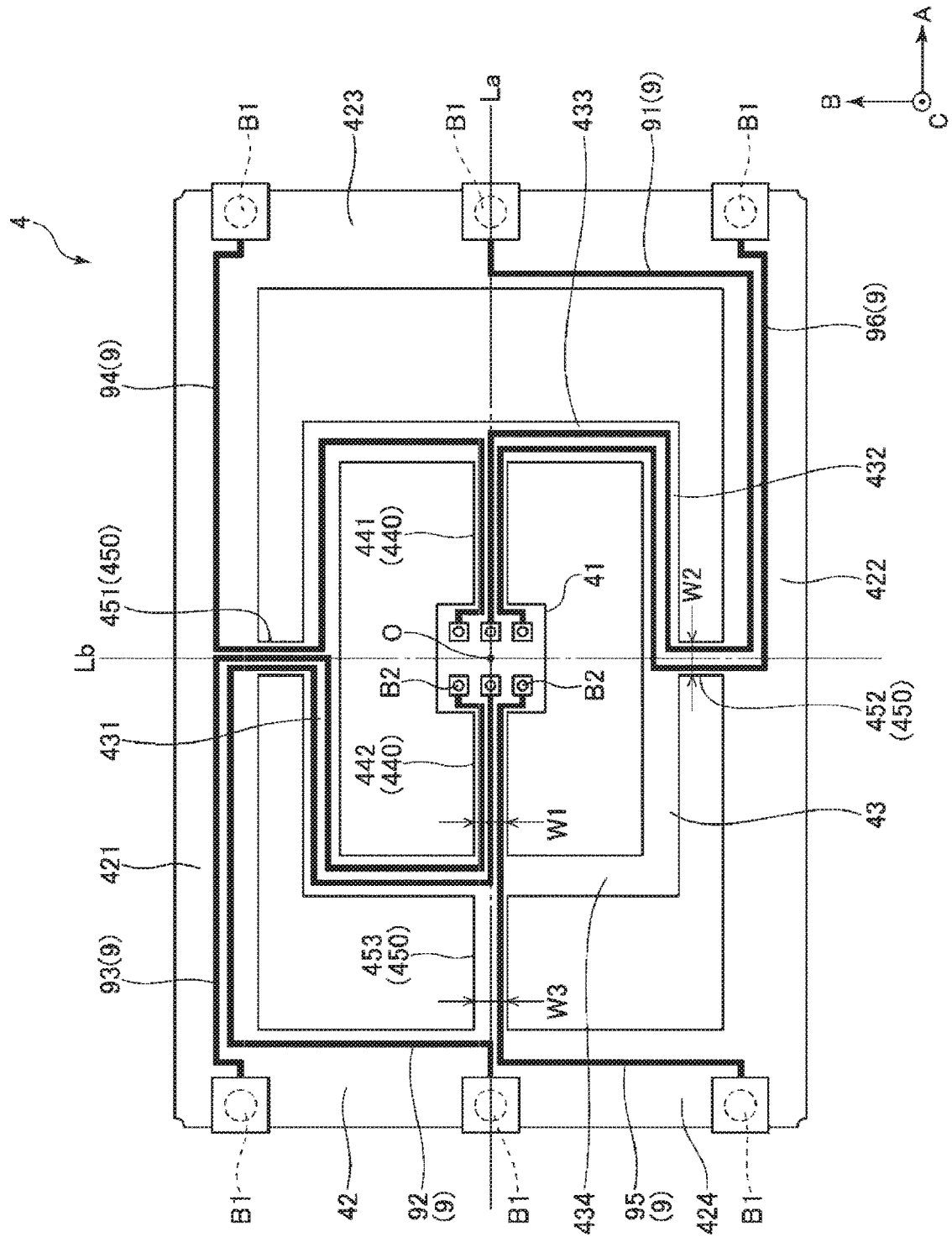
FIG. 12 is a plan view showing a modified example of the support substrate shown in FIG. 11.

FIG. 11 is a plan view showing a support substrate provided to a vibrator device according to a third embodiment. FIG. 12 is a plan view showing a modified example of the support substrate shown in FIG. 11.

The present embodiment is substantially the same as the second embodiment described above except the point that the arrangement of the third beam 453 and the arrangement of the interconnections 91 through 96 are different. It should be noted that in the following description, the present embodiment will be described with a focus on the difference from the second embodiment described above, and the description of substantially the same issues will be omitted. Further, in FIG. 11 and FIG. 12, the constituents substantially the same as those of the second embodiment described above are denoted by the same reference symbols.

As shown in FIG. 11, in the support substrate 4 in the present embodiment, the third beam 453 extends from the frame 43 toward the negative side of the A axis to couple the frame 43 and the supporting base 42 to each other. Further, the third beam 453 is disposed along the imaginary straight line La.

Further, the drive signal interconnection 91 and the second detection ground interconnection 96 are each laid around to the supporting base 42 from the element mounting base 41 through the first beam 441, the frame 43, and the second beam 452. Further, the first detection ground interconnection 94 is laid around to the supporting base 42 from the element mounting base 41 through the first beam 441, the frame 43, and the second beam 451.

Further, the drive ground interconnection 92, the first detection signal interconnection 93, and the second detection signal interconnection 95 are each laid around to the supporting base 42 from the element mounting base 41 through the first beam 442, the frame 43, and the third beam 453. By laying around the first and second detection signal interconnections 93, 95 through the third beam 453 as described above, it becomes easy to lay around the first and second detection signal interconnections 93, 95. Further, it is possible to shorten the wiring length of the first and second detection signal interconnections 93, 95 compared to the first embodiment described above. Therefore, it becomes difficult for the noise to be superimposed on the first and second detection signal interconnections 93, 95. In particular, since the third beam 453 is disposed in alignment with the pair of first beams 441, 442, it is possible to dispose the first and second detection signal interconnections 93, 95 on a straight line, and it is possible to make the wiring length of the first and second detection signal interconnections 93, 95 shorter. Further, since the number of the interconnections 9 passing through the second beams 451, 452 decreases from six to three compared to the first embodiment described above, it becomes easy to lay around the interconnections 9 on the second beams 451, 452.

According also to such an arrangement of the interconnections 91 through 96, the drive signal interconnection 91 and the first and second detection signal interconnections 93, 95 are laid around to the element mounting base 41 and the frame 43 passing through the respective inner beams 440 different from each other, and further laid around to the frame 43 and the supporting base 42 passing through the respective outer beams 450 different from each other. Therefore, the drive signal interconnection 91 and the first and second detection signal interconnections 93, 95 are disposed with a sufficient distance, and it becomes difficult for the drive signal interconnection 91 and the first and second detection signal interconnections 93, 95 to interfere with each other. Therefore, it becomes difficult for the noise caused by an influence of the drive signal applied to the drive signal interconnection 91 to mix in the first and second detection signal interconnections 93, 95, and it is possible to effectively suppress the deterioration of the detection accuracy of the angular velocity ωc.

According also to such a third embodiment as described above, substantially the same advantages as in the first embodiment described above can be exerted.

It should be noted that the wiring pattern of the interconnections 91 through 96 is not particularly limited providing the drive signal interconnection 91 and the first and second detection signal interconnections 93, 95 are laid around to the element mounting base 41 and the supporting base 42 through the respective inner beams 440 different from each other and the respective outer beams 450 different from each other. For example, as shown in FIG. 12, it is possible for each of the drive ground interconnection 92 and the first detection signal interconnection 93 to be laid around to the supporting base 42 from the element mounting base 41 through the first beam 442, the frame 43, and the second beam 451. In such a configuration, since only the second detection signal interconnection 95 is made to pass through the third beam 453, it is possible to make the width W3 of the third beam 453 smaller. Therefore, the decrease in the degree of freedom of the frame 43 with respect to the supporting base 42 is prevented, and it becomes difficult for the stress to reach the vibrator element 6 from the base 21.

Fourth Embodiment

FIG. 13 is a plan view showing a support substrate provided to a vibrator device according to a fourth embodiment. FIG. 14 is a plan view showing a modified example of the support substrate shown in FIG. 13.

The present embodiment is substantially the same as the second and third embodiments described above except the point that the number of the third beams included in the outer beams 450 and the arrangement of the interconnections 91 through 96 are different. It should be noted that in the following description, the present embodiment will be described with a focus on the difference from the second and third embodiments described above, and the description of substantially the same issues will be omitted. Further, in FIG. 13 and FIG. 14, the constituents substantially the same as those of the second and third embodiments described above are denoted by the same reference symbols.

As shown in FIG. 13, in the support substrate 4 in the present embodiment, the outer beams 450 has a pair of third beams 453, 454 in addition to the pair of second beams 451, 452. The pair of third beams 453, 454 respectively extend from the frame 43 toward both the sides of a direction along the A axis to couple the frame 43 and the supporting base 42 to each other. Further, the pair of third beams 453, 454 are disposed on a straight line along the imaginary straight line La, and are arranged in alignment with the pair of first beams 441, 442. It should be noted that this is not a limitation, and for example, it is also possible for at least one of the pair of third beams 453, 454 to be shifted in a direction along the B axis from the imaginary straight line La.

Further, the drive signal interconnection 91 is laid around to the supporting base 42 from the element mounting base 41 through the first beam 441, the frame 43, and the third beam 453. By laying around the drive signal interconnection 91 through the third beam 453 as described above, it becomes easy to lay around the drive signal interconnection 91. Further, it is possible to shorten the wiring length of the drive signal interconnection 91 compared to the first embodiment described above.

Further, the first detection ground interconnection 94 is laid around to the supporting base 42 from the element mounting base 41 through the first beam 441, the frame 43, and the second beam 451. Further, the second detection ground interconnection 96 is laid around to the supporting base 42 from the element mounting base 41 through the first beam 441, the frame 43, and the second beam 452.

Further, the drive ground interconnection 92, the first detection signal interconnection 93, and the second detection signal interconnection 95 are each laid around to the supporting base 42 from the element mounting base 41 through the first beam 442, the frame 43, and the third beam 454. By laying around the first and second detection signal interconnections 93, 95 through the third beam 454 as described above, it becomes easy to lay around the first and second detection signal interconnections 93, 95. Further, it is possible to shorten the wiring length of the first and second detection signal interconnections 93, 95 compared to the first embodiment described above.

According also to such an arrangement of the interconnections 91 through 96, the drive signal interconnection 91 and the first and second detection signal interconnections 93, 95 are laid around to the element mounting base 41 and the frame 43 passing through the respective inner beams 440 different from each other, and further laid around to the frame 43 and the supporting base 42 passing through the respective outer beams 450 different from each other. Therefore, the drive signal interconnection 91 and the first and second detection signal interconnections 93, 95 are disposed with a sufficient distance, and it becomes difficult for the drive signal interconnection 91 and the first and second detection signal interconnections 93, 95 to interfere with each other. Therefore, it becomes difficult for the noise caused by an influence of the drive signal applied to the drive signal interconnection 91 to mix in the first and second detection signal interconnections 93, 95, and it is possible to effectively suppress the deterioration of the detection accuracy of the angular velocity ωc.

As described above, in the vibrator device 1 according to the present embodiment, the outer beams 450 includes the pair of third beams 453, 454 which extend toward both the sides from the frame 43. Further, the drive signal interconnection 91 and the first and second detection signal interconnections 93, 95 are laid around to the frame 43 and the supporting base 42 through the respective third beams 453, 454 different from each other. By laying around the drive signal interconnection 91 and the first and second detection signal interconnections 93, 95 through the third beams 453, 454 as described above, it becomes easy to lay around the drive signal interconnection 91 and the first and second detection signal interconnections 93, 95. Further, it is possible to shorten the wiring length of the drive signal interconnection 91 and the first and second detection signal interconnections 93, 95 compared to the first embodiment described above.

According also to such a fourth embodiment as described above, substantially the same advantages as in the first embodiment described above can be exerted.

It should be noted that the wiring pattern of the interconnections 91 through 96 is not particularly limited providing the drive signal interconnection 91 and the first and second detection signal interconnections 93, 95 are laid around to the element mounting base 41 and the supporting base 42 through the respective inner beams 440 different from each other and the respective outer beams 450 different from each other. For example, as shown in FIG. 14, it is possible for the first detection signal interconnection 93 to be laid around to the supporting base 42 from the element mounting base 41 through the first beam 442, the frame 43 and the second beam 451, and it is possible for the second detection signal interconnection 95 to be laid around to the supporting base 42 from the element mounting base 41 through the first beam 442, the frame 43, and the second beam 452. In such a configuration, since only the drive signal interconnection 91 is made to pass through the third beam 453, and only the drive ground interconnection 92 is made pass through the third beam 454, it is possible to make the width W3 of the third beams 453, 454 smaller. Therefore, the decrease in the degree of freedom of the frame 43 with respect to the supporting base 42 is prevented, and it becomes difficult for the stress to reach the vibrator element 6 from the base 21.

Although the vibrator device, the electronic apparatus, and the vehicle according to the present disclosure are described based on the illustrated embodiments, the present disclosure is not limited thereto, but the configuration of each of the sections can be replaced with an arbitrary configuration having substantially the same function. Further, the present disclosure can also be added with any other constituents. Further, it is also possible to arbitrarily combine any of the embodiments with each other.

For example, although in the embodiments described above, the vibrator element 6 is located above the support substrate 4, this is not a limitation, and it is possible for the vibrator element 6 to be located, for example, below the support substrate 4 and supported so as to be suspended from the support substrate 4. Further, although in the embodiment described above, the support substrate 4 is fixed to the base 21, this is not a limitation, and for example, it is possible for the support substrate 4 to be fixed to the circuit element 3.

What is claimed is:

1. A vibrator device comprising:
    a vibrator element;
    a support substrate configured to support the vibrator element; and
    a plurality of interconnections provided to the support substrate, wherein
    the vibrator element includes
        a drive arm which is provided with a drive signal electrode, and performs a drive vibration in response to application of a drive signal to the drive signal electrode, and
        a detection arm which is provided with a detection signal electrode, and performs a detection vibration in accordance with a physical quantity of a detection target to thereby output a detection signal from the detection signal electrode,
    the support substrate includes, in a plan view from a thickness direction of the support substrate,
        an element mounting base on which the vibrator element is mounted,
        a supporting base located outside the element mounting base,
        a frame located between the element mounting base and the supporting base, and shaped like a frame surrounding the element mounting base,
        inner beams provided with a pair of first beams which extend toward both sides along a first direction from the element mounting base to couple the element mounting base and the frame to each other, and
        outer beams provided with a pair of second beams which extend toward both sides along a second direction different from the first direction from the frame to couple the frame and the supporting base to each other,
    the plurality of interconnections includes
        a drive signal interconnection which is electrically coupled to the drive signal electrode, and is laid around to the element mounting base and the supporting base, and
        a detection signal interconnection which is electrically coupled to the detection signal electrode, and is laid around to the element mounting base and the supporting base, and
    the drive signal interconnection and the detection signal interconnection are laid around to the element mounting base and the frame through the respective inner beams different from each other, and are laid around to the frame and the supporting base through the respective outer beams different from each other.

2. The vibrator device according to claim 1, wherein
the outer beams include a third beam which extends from the frame to couple the frame and the supporting base to each other, and
one of the drive signal interconnection and the detection signal interconnection is laid around to the frame and the supporting base through the third beam.

3. The vibrator device according to claim 1, wherein
the outer beams include a pair of third beams extending from the frame toward both sides of the frame, and
the drive signal interconnection and the detection signal interconnection are laid around to the frame and the supporting base through the respective third beams different from each other.

4. The vibrator device according to claim 2, wherein
in the plan view, the third beam extends in the first direction, and is located in alignment with the first beams.

5. The vibrator device according to claim 2, wherein
a number of the interconnections passing through the third beam is no larger than two.

6. The vibrator device according to claim 1, wherein
defining three axes perpendicular to each other as an A axis, a B axis, and a C axis,
a thickness direction of the support substrate is parallel to the C axis, and
the vibrator element includes
    a base member fixed to the element mounting base,
    a pair of the detection arms extending toward both sides along the B axis from the base member,
    a pair of coupling arms extending toward both sides along the A axis from the base member,
    a pair of the drive arms extending toward both sides along the B axis from a tip part of one of the coupling arms, and
    a pair of the drive arms extending toward both sides along the B axis from a tip part of the other of the coupling arms.

7. The vibrator device according to claim 6, wherein
the first direction is a direction along the A axis, and
the second direction is a direction along the B axis.

* * * * *